United States Patent [19]
de Frésart et al.

[11] Patent Number: 6,084,268
[45] Date of Patent: *Jul. 4, 2000

[54] POWER MOSFET DEVICE HAVING LOW ON-RESISTANCE AND METHOD

[75] Inventors: Edouard D. de Frésart; Pak Tam, both of Tempe; Hak-Yam Tsoi, Scottsdale, all of Ariz.

[73] Assignee: Semiconductor Components Industries, LLC, Phoenix, Ariz.

[*] Notice: This patent issued on a continued prosecution application filed under 37 CFR 1.53(d), and is subject to the twenty year patent term provisions of 35 U.S.C. 154(a)(2).

[21] Appl. No.: 08/962,725

[22] Filed: Nov. 3, 1997

Related U.S. Application Data

[63] Continuation of application No. 08/610,940, Mar. 5, 1996, abandoned.

[51] Int. Cl.[7] ............................ H01L 29/76; H01L 29/94; H01L 31/062
[52] U.S. Cl. ........................... 257/342; 257/339; 257/341
[58] Field of Search .................... 257/339, 341, 257/342, 329, 330, 331, 333

[56] References Cited

U.S. PATENT DOCUMENTS 5,273,922  12/1993  Tsoi ............................................. 437/41
5,438,215  8/1995  Tihanyi ..................................... 257/342

FOREIGN PATENT DOCUMENTS

| 0779665 | 11/1996 | European Pat. Off. | 257/342 |
| 60-132371 | 7/1985 | Japan | 257/339 |
| 62-101077 | 5/1987 | Japan | 257/342 |
| 1-192174 | 8/1989 | Japan | 257/331 |
| 1-209766 | 8/1989 | Japan | 257/342 |
| 2-216871 | 8/1990 | Japan | 257/342 |

*Primary Examiner*—Steven H. Loke
*Attorney, Agent, or Firm*—Robert D. Atkins

[57] ABSTRACT

A power MOSFET device (40) includes one or more localized regions of doping (61,62,63) formed in a more lightly doped semiconductor layer (42). The one or more localized regions of doping (61,62,63) reduce inherent resistances between the source regions (47,48) and the drain region (41) of the device. The one or more localized regions of doping (61,62,63) are spaced apart from the body regions (44,46) to avoid detrimentally impacting device breakdown voltage. In an alternative embodiment, a groove (122) or trench (152) design is incorporated to reduce JFET resistance (34). In a further embodiment, a gate dielectric layer having a thick portion (77,97,128,158) and thin portions (76,126,156) is incorporated to enhance switching characteristics and/or breakdown voltage.

14 Claims, 3 Drawing Sheets

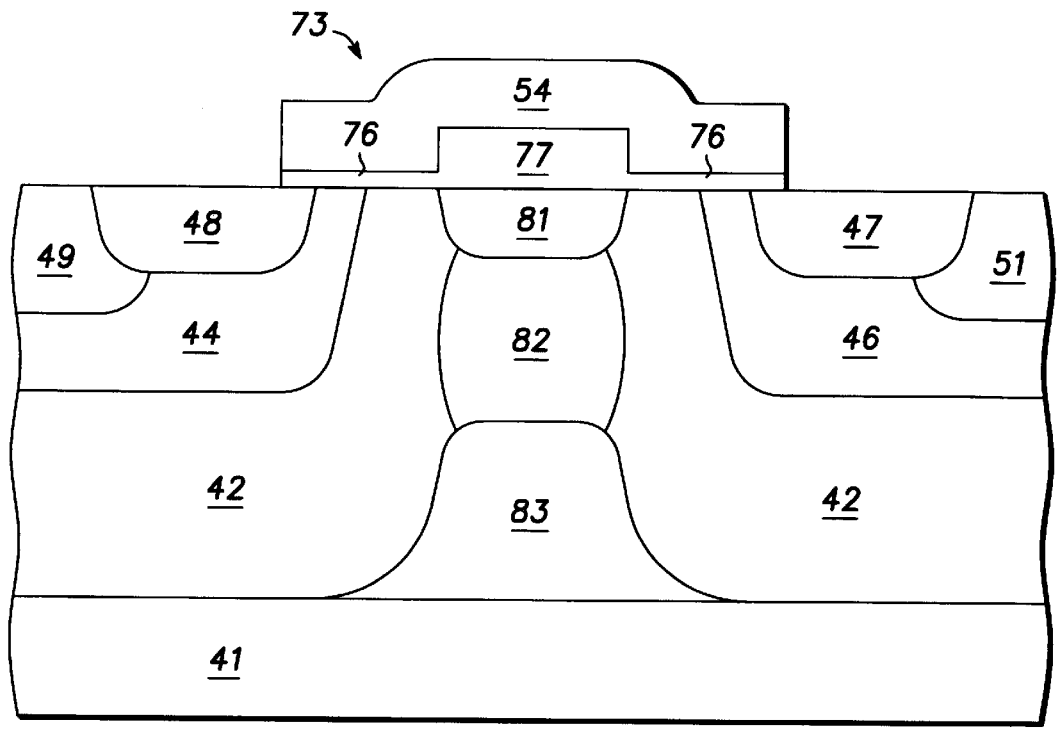
70 FIG. 3
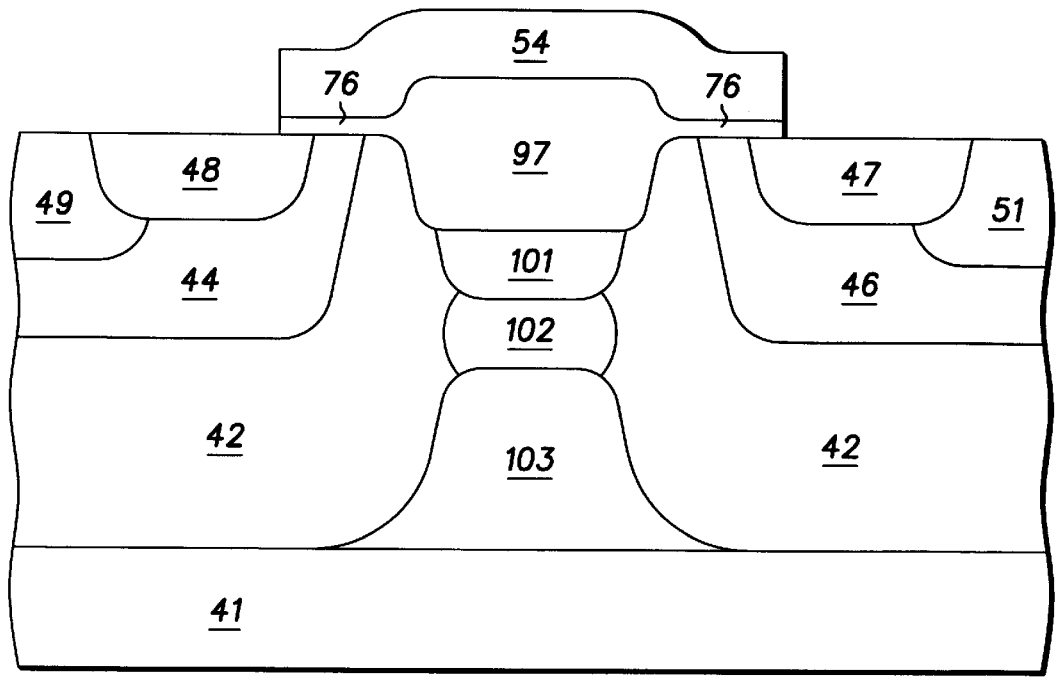
90 FIG. 4

POWER MOSFET DEVICE HAVING LOW ON-RESISTANCE AND METHOD

This application is a continuation of prior application Ser. No. 08/610,940, filed Mar. 5, 1996, now abandoned.

BACKGROUND OF THE INVENTION

This invention relates, in general, to semiconductor wafer processing, and more particularly to methods for forming power metal oxide semiconductor field effect transistor (MOSFET) devices.

Power MOSFET devices are well known and are used in many applications including automotive electronics, portable electronics, power supplies, and telecommunications. One important electrical characteristic of a power MOSFET device is its on-state resistance ($R_{DS(on)}$), which is defined as the total resistance encountered by a drain current as it flows from the drain terminal to the source terminal. In a vertical power MOSFET device, this total resistance is composed of several resistive components commonly referred to as an inversion channel resistance, a gate-drain accumulation resistance, a junction field effect transistor (JFET) pinch region resistance (i.e., a JFET resistance), a spreading resistance, a bulk resistance, and a starting substrate resistance.

In order to allow manufacturers to produce power MOSFET devices having higher current carrying capability in smaller packages, it would be advantageous to have MOSFET structures that reduce one or more of the above resistive components thereby lowering $R_{DS(on)}$. It would be of further advantage to do so without detrimentally impacting other MOSFET characteristics.

BRIEF DESCRIPTION OF THE DRAWINGS

FIG. 3 illustrates an enlarged cross-sectional view of another embodiment of a power MOSFET device according to the present invention;

FIG. 4 illustrates an enlarged cross-sectional view of yet another embodiment of a power MOSFET device according to the present invention;

DETAILED DESCRIPTION OF THE DRAWINGS

In general, the present invention relates to structures and methods that provide, among other things, a lower resistance path between a channel portion and a drain portion of a power MOSFET device. In particular, the present invention incorporates one or more regions of localized doping within a power MOSFET device to enhance its on-resistance ($R_{DS(on)}$). In alternative embodiments, a varying thickness gate dielectric layer, a trench, and/or a groove are incorporated with the one or more regions of localized doping to improve on-resistance and switching speed without detrimentally impacting breakdown voltage. The present invention can be better understood by referring to FIGS. 1–6 together with the following detailed description.

Figure 1:
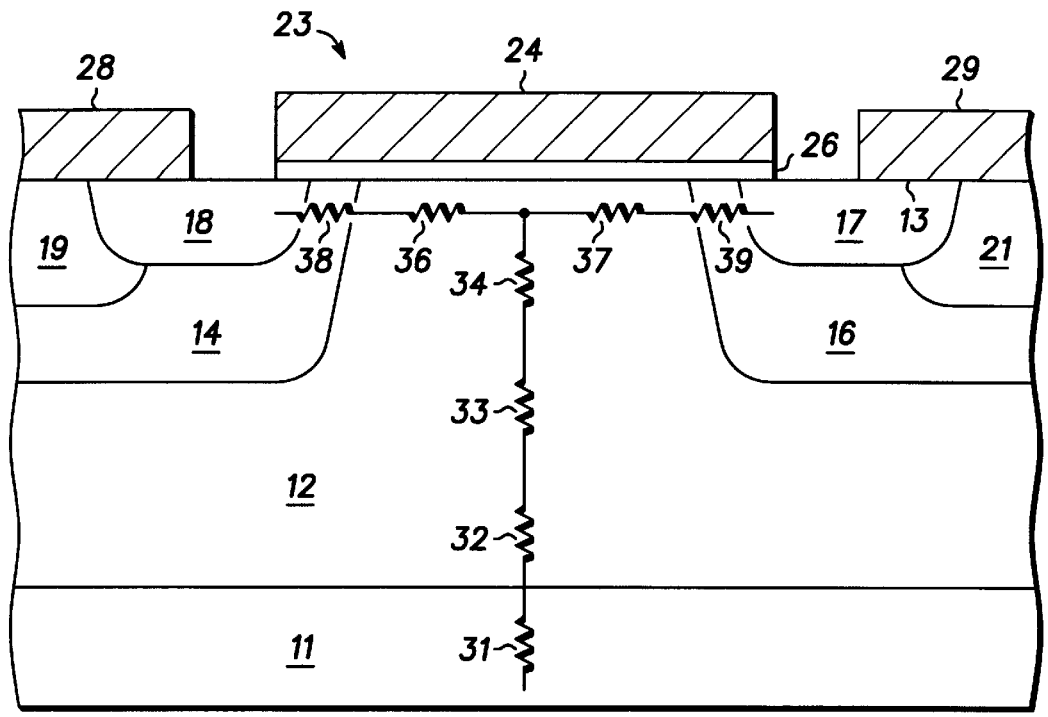
FIG. 1 illustrates an enlarged cross-sectional view of a portion of a power MOSFET device showing various inherent resistive components.

FIG. 1 shows an enlarged cross-sectional view of a conventional vertical power MOSFET device, which is generally designated 10. Device 10 is shown to illustrate the various resistive components present in a power MOSFET device that contribute to $R_{DS(on)}$. Device 10 and the present invention (as shown in FIGS. 2–6) are described as n-channel devices. However, as those skilled in the art will appreciate, the present invention equally applies to p-channel devices.

Device 10 includes a semiconductor substrate 11 having a semiconductor layer 12 formed on one surface. For an n-channel device, substrate 11 comprises a heavily doped n-type substrate and semiconductor layer 12 comprises a more lightly doped n-type layer. Device 10 further includes lightly doped p-type regions 14 and 16, n-type source regions 17 and 18, and p-type contact regions 19 and 21, all of which extend from a major surface 13 into semiconductor layer 12.

A gate structure 23 is formed on major surface 13 and includes a gate control layer 24 and a gate dielectric layer 26. Ohmic contacts 28 and 29 provide contact to source regions 17 and 18 and contact regions 19 and 21. Substrate 11 forms a drain region of device 10. During operation, an appropriate gate bias is applied to gate control layer 24, which results in the formation of channel regions in p-type regions 14 and 16 in the vicinity of major surface 13 thereby allowing current to flow in device 10.

When device 10 is in a current conducting mode, current flowing between the drain and source regions 17 and 18 is impacted by several resistances including a substrate resistance 31, a bulk resistance 32, a spreading resistance 33, a JFET resistance 34, accumulation resistances 36 and 37, and channel resistances 38 and 39. Other resistive components contribute to $R_{DS(on)}$ including ohmic contact resistances, metal spreading resistances, and package related resistances.

In order to provide lower $R_{DS(on)}$ characteristics, the above resistances must be lowered. Substrate resistance 31 is reduced by increasing the amount of dopant present in semiconductor substrate 11. However, because of dopant solubility limits and crystallographic defect constraints, an upper limit exists on the amount of dopant that actually can be incorporated into substrate 11.

Accumulation resistances 36 and 37 are resistances that affect carriers in the vicinity of major surface 13 between p-type regions 14 and 16. These resistances typically are reduced as the applied gate voltage causes additional majority carriers in semiconductor layer 12 to accumulate near major surface 13. Thus, the thickness of gate dielectric layer 26 and the magnitude of the voltage applied to gate control layer 24 affect the accumulation resistance.

Channel resistances 38 and 39 are resistances that affect carriers in the vicinity of major surface 13 between semiconductor layer 12 and source regions 17 and 18. These resistances are reduced, for example, by shrinking the dimensions of device 10. However, manufacturing capabilities set limits on achievable shrinkage.

Studies by the authors of the present invention indicate that bulk resistance 32, spreading resistance 33, and JFET resistance 34 are significant contributors to $R_{DS(on)}$, particularly when the dopant concentration of semiconductor layer 12 decreases and its thickness increases. The present invention provides structures and methods for reducing bulk resistance 32, spreading resistance 33, and/or JFET resistance 34, without detrimentally impacting breakdown voltage.

Figure 2:
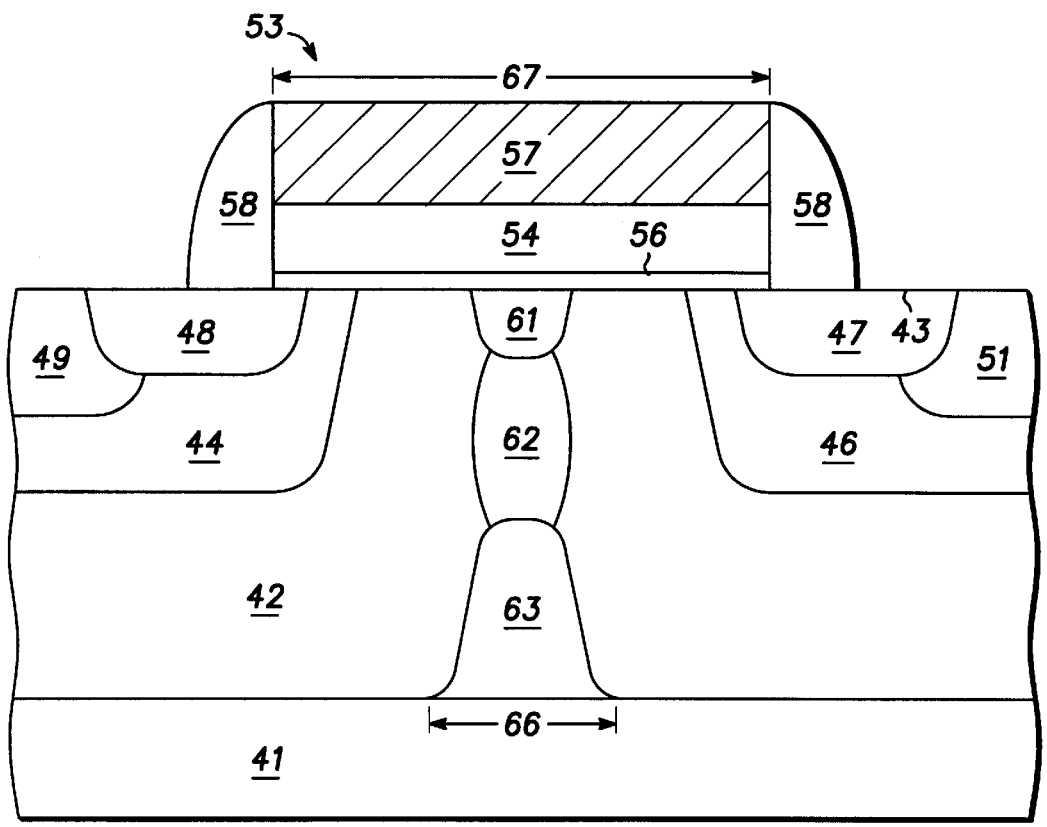
FIG. 2 illustrates an enlarged cross-sectional view of an embodiment of a power MOSFET device according to the present invention.

FIG. 2 illustrates an enlarged cross-sectional view of an embodiment of a planar vertical power MOSFET or insulated gate field effect transistor (IGFET) device in accordance with the present invention, which is generally referred to as device 40. Like device 10, device 40 includes an n-type conductivity semiconductor substrate 41 and an n-type semiconductor layer 42. As an example, semiconductor substrate 41 comprises an arsenic or antimony doped silicon substrate having a dopant concentration in a range from about $1.0 \times 10^{19}$ to about $1.0 \times 10^{20}$ atoms/cm³. Semiconductor substrate 41 provides a drain or drain region for device 40.

The amount of dopant present in semiconductor layer 42 and its thickness are a function of the desired breakdown voltage of device 40. For a 60 volt device, semiconductor layer 42 has a dopant concentration in range from about $5.0 \times 10^{15}$ to about $1.0 \times 10^{16}$ atoms/cm³ and has a starting thickness in a range from about 5 microns to about 10 microns. Semiconductor layer 42 preferably is formed using conventional epitaxial growth techniques, but other methods such as wafer bonding and counter-doping techniques may be used. As those skilled in the art will appreciate, semiconductor substrate 41 and semiconductor layer 42 together are commonly referred to as a semiconductor wafer or a body of semiconductor material.

Device 40 further includes p-type conductivity regions or body regions 44 and 46, n-type source regions 47 and 48, and p-type contact regions 49 and 51. These regions extend from a major surface 43 into semiconductor layer 42. In a preferred embodiment, p-type regions 44 and 46 have a surface dopant concentration of about $1.0 \times 10^{17}$ to about $5.0 \times 10^{17}$ atoms/cm³, source regions 47 and 48 have a surface dopant concentration in a range from about $1.0 \times 10^{19}$ to about $1.0 \times 10^{20}$ atoms/cm³, and contact regions 49 and 51 have a surface dopant concentration in a range from about $1.0 \times 10^{18}$ to about $1.0 \times 10^{20}$ atoms/cm³.

A gate structure 53 is formed over major surface 43 and includes a gate dielectric layer 56, a gate control electrode layer 54, a dielectric layer 57, and spacers 58. Gate dielectric layer 56 comprises, for example, a gate oxide layer having a thickness in a range from about 150 angstroms to about 850 angstroms. Gate electrode layer 54 preferably comprises a doped polycrystalline semiconductor material (e.g., doped polysilicon or the like) and has a thickness of about 2,500 angstroms to about 5,000 angstroms.

Dielectric layer 57 functions to isolate gate control electrode layer 54 and comprises, for example, a silicon oxide, a silicon nitride, combinations thereof, or the like. Spacers 58 comprise, for example, a silicon oxide or a silicon nitride and allow for the self-alignment of contact regions 49 and 51. Gate dielectric layer 56, gate electrode layer 54, dielectric layer 57, and spacers 58 are formed using well known processing techniques.

According to the present invention, device 40 further includes at least one doped region or region of localized doping within semiconductor layer 42 between p-type regions 44 and 46. The region of localized doping has the same conductivity type as semiconductor layer 42, but has a higher dopant concentration thereby lowering the series resistance between the channel regions and the drain region of device 40. Also, the region of localized doping is spaced apart from p-type regions 44 and 46 to avoid impacting the breakdown voltage of device 40. That is, it is important that the region of localized doping not be too close to one or both of p-type regions 44 and 46 so that it does not interfere with the depletion spread of these regions during reverse bias operation.

Referring again to FIG. 2, the at least one doped region comprises a first doped or down-doped region 61, a second doped or mid-doped region 62, or a third doped or up-doped region 63. In a preferred embodiment and as shown in FIG. 2, device 40 includes all three doped regions. It is understood that the present invention encompasses a device with one or more of the above doped regions.

Up-doped region 63 preferably is formed prior to the formation of semiconductor layer 42. For example, conventional masking and doping techniques are used to selectively incorporate dopant into substrate 41. Then, during the formation of semiconductor layer 42 and during subsequent high temperature processing, up-doped region 63 is formed by dopant diffusing from substrate 41.

Dimension 66 defines a desired width of up-doped region 63. Preferably, dimension 66 is about 25% of the gate width (shown as dimension 67 in FIG. 2) to provide a reduction in $R_{DS(on)}$ and to avoid detrimentally impacting breakdown voltage.

To illustrate the benefit of up-doped region 63, experiments showed that a 20 volt device with an n-type up-doped region 63 formed by a 60 KeV $5.0 \times 10^{15} - 2.0 \times 10^{16}$ atoms/cm² phosphorous implant and having a width of 25% of the gate width exhibited about a 14% reduction in $R_{DS(on)}$ without significantly impacting breakdown voltage.

However, as dimension 66 increases to about 80% of the gate width on a 20 volt device, breakdown voltage is reduced by about 30%.

Mid-doped region 62 preferably is formed using conventional masking techniques (e.g., patterned photoresist, patterned dielectric layer(s), or the like) and high energy (i.e., in range from about 0.25 to about 1 MeV) ion implantation techniques. Alternatively, a double charged ion implant is used. In an optional embodiment, mid-doped region 62 is formed after a portion of or after all of gate structure 53 has been formed using conventional masking techniques. In this optional embodiment, the implant energy is adjusted to compensate for the added layers present on major surface 43.

Depending on the thickness of semiconductor layer 42, one or more high energy implants are used to form mid-doped region 62. That is, as semiconductor layer 42 increases in thickness, one or more additional implants become necessary to provide localized doping in the mid-portion of the layer. Preferably a dose or doses greater than about $1.0 \times 10^{14}$ to about $1.0 \times 10^{15}$ atoms/cm² are used with the implant energy or energies adjusted to place mid-doped region 62 so that it connects to up-doped region 63 after all high temperature processing is complete. Up-doped region 63 and mid-doped region 62 provide a reduction in bulk resistance 32 and spreading resistance 33 (shown in FIG. 1) because of the localized increase in dopant concentration within semiconductor layer 42.

Down-doped region 61 preferably is formed using conventional masking and doping techniques. Preferably, down-diffusion region 61 is formed using the same masking step as mid-doped region 62. A lower energy (i.e., about 30 KeV to about 120 KeV) implant with a dose (or doses) greater than about $1.0 \times 10^{13}$ to about $1.0 \times 10^{5}$ atoms/cm² being suitable. Preferably, the implant energy is adjusted depending on the thickness of semiconductor layer 42 such that after all high temperature processing, down-doped layer 61 connects to mid-doped region 62.

In an optional embodiment, down-doped region 61 is formed after a portion of or after all of gate structure 53 has been formed using conventional masking techniques. In this optional embodiment, the implant energy is adjusted to compensate for the added layers present on major surface 43. Down-doped region 61 provides a reduction in JFET resistance 34 (shown in FIG. 1) because of the localized increase in dopant concentration in the vicinity of where the parasitic JFET typically pinches off.

The widths of down-doped region 61 and mid-doped region 62 are chosen so that they do not detrimentally impact the breakdown voltage of device 40 (i.e., they do not interfere with the depletion regions of p-type regions 44 and 46). This is done knowing, for example, the spacing between p-type regions 44 and 46, the dopant concentration of semiconductor layer 42, and the rated voltage of device 40. The dopant level within down-doped region 61, mid-doped region 62, and up-doped region 63 is typically greater than twice the dopant level within semiconductor layer 42, with a dopant concentration in a range from about $1.0 \times 10^{17}$ to about $1.0 \times 10^{19}$ atoms/cm$^3$ being preferred.

FIG. 3 illustrates an enlarged cross-sectional view of another embodiment of a power MOSFET device according to the present invention, which is generally referred to as device 70. Device 70 is similar to device 40 except for gate structure 73. Gate structure 73 includes a gate dielectric layer having a thick portion 77 and thin portions 76. Gate structure 73 further includes a gate conductive layer 54 formed over thick portion 77 and thin portions 76.

Thick portion 77 preferably is on the order of 1,000 to 3,000 angstroms thick while thin portions 76 preferably are on the order of 250 to 850 angstroms thick. The gate dielectric layer shown is formed, for example, using a two step deposition or growth process. Alternatively, a single dielectric layer is formed having the desired thickness for thick portion 77. Next, a photolithographic step and an etch step are done to selectively remove portions of the dielectric layer to the desired thickness for thin portions 76.

Thick portion 77 functions to decrease the parasitic gate to drain capacitance of device 70, which in turn increases its switching speed. However, the accumulation resistance (i.e., resistances 36 and 37 shown in FIG. 1) increases with the presence of thick portion 77. This increases the importance of placing a down-doped region 81 in semiconductor layer 42 to compensate for this increase in accumulation resistance (i.e., to compensate for the reduction in accumulated carriers near the surface of semiconductor layer 42). In a preferred embodiment, device 70 further includes a mid-doped region 82 and an up-doped region 83 to decrease the JFET, bulk, and spreading resistances thereby providing a lower $R_{DS(on)}$.

FIG. 4 illustrates an additional embodiment of a power MOSFET device according to the present invention, which is generally referred to as device 90. Device 90 is similar to device 70 except that thick portion 97 comprises a localized oxidation of silicon (LOCOS) region, which is formed using conventional techniques. Device 90 includes a down-doped region 101, a mid-doped region 102, and/or an up-doped region 103

Down-doped region 101 and mid-doped region 102 are formed either before or after the formation of thick portion 97 using conventional masking techniques. When these regions are formed after thick portion 97 is formed, the implant energy is adjusted accordingly to compensate for the presence of the thick dielectric region. The LOCOS region has an advantage in that the JFET resistance is reduced because thick portion 97 consumes a portion of semiconductor layer 42 and its presence inhibits pinch-off as the depletion regions of p-type regions 44 and 46 spread into semiconductor layer 42. This in turn further reduces $R_{DS(on)}$.

Figure 5:
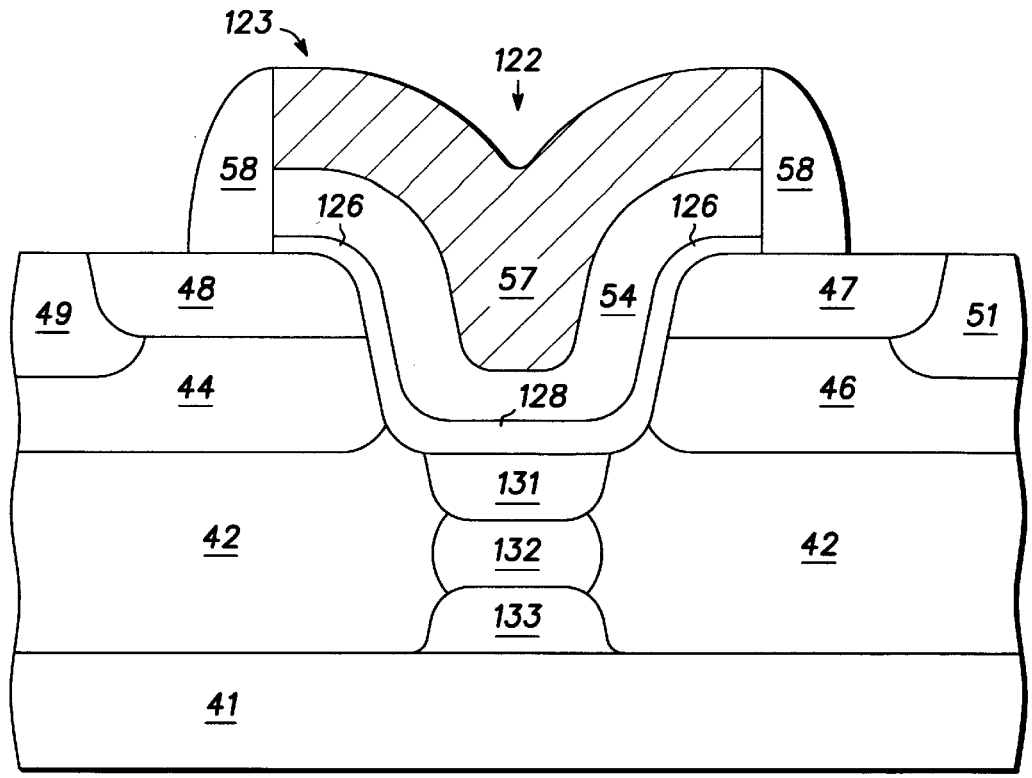
FIG. 5 illustrates an enlarged cross-sectional view of an additional embodiment of a power MOSFET device according to the present invention.

FIG. 5 illustrates a further embodiment of a power MOSFET device according to the present invention, which is generally designated 110. Device 110 is similar to device 70 with the exception of gate structure 123. A portion of gate structure 123 is formed in a groove 122, which is formed in semiconductor layer 42. Groove 122 is formed using, for example, etching techniques, LOCOS techniques, or the like. When using LOCOS, the formed oxide is removed to provide groove 122 and a portion of gate structure 123 is subsequently formed in groove 122.

Like device 70, gate structure 123 includes a gate dielectric layer that has a thick portion 128 and thin portions 126. Thick portion 128 is formed on the bottom or lower surface of groove 122. Device 110 preferably includes down-doped region 131 to compensate for the increase in accumulation resistance, which results from thick portion 128. Device 110 preferably further includes mid-doped region 132 and up-doped region 133 to decrease bulk and spreading resistances.

Preferably, doped regions 131 and 132 are formed after groove 122 is formed. Up-doped region 133 is formed similar to up-doped region 63 as described above. Optionally, up-doped region 133 is formed using high energy implantation techniques. This depends on the distance between the bottom of groove 122 and the bottom of semiconductor layer 42.

Device 110 has an advantage in that groove 122 functions to prevent pinch-off from occurring as the depletion regions of p-type regions 44 and 46 spread into semiconductor layer 42. This further reduces $R_{DS(on)}$ because the JFET resistive component is reduced.

With thick portion 128, device 110 has enhanced switching characteristics because gate to drain capacitance is reduced. Thick portion 128 also is important because that portion of the major surface of semiconductor layer 42 in groove 122 is closer to p-type regions 44 and 46. Without thick portion 128, surface breakdown can occur due to, among other things, hot carrier injection into the gate dielectric layer. By having a thicker dielectric layer at the bottom of the groove, premature breakdown is avoided.

Figure 6:
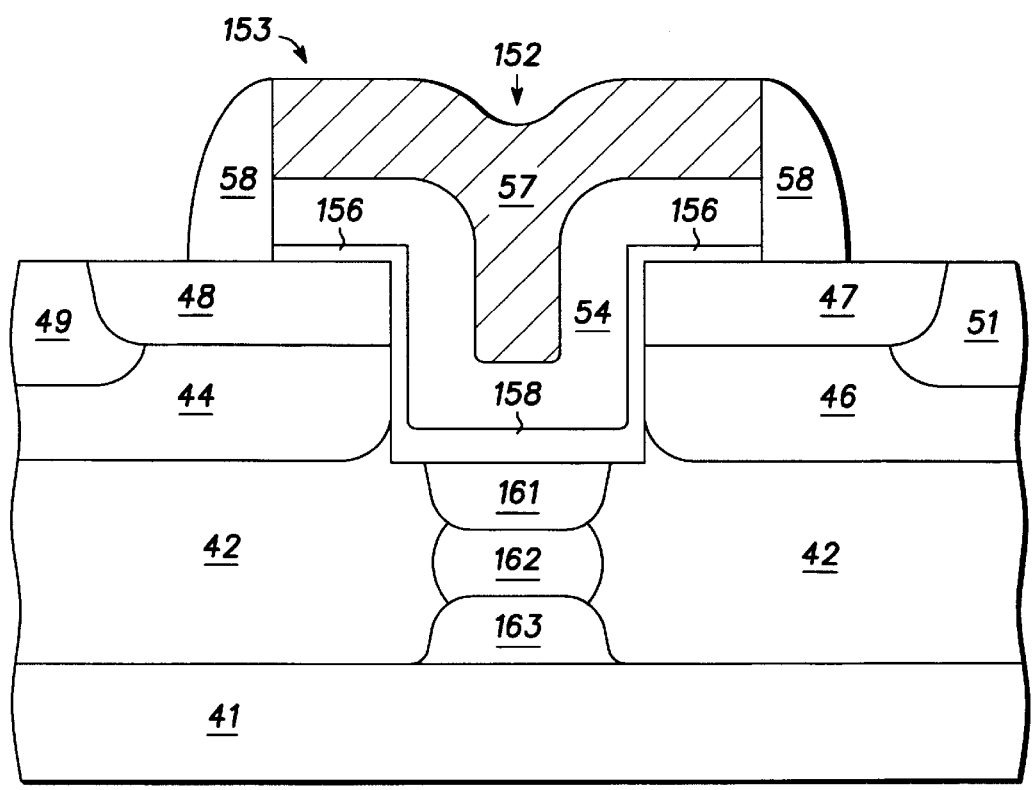
FIG. 6 illustrates an enlarged cross-sectional view of a further embodiment of a power MOSFET device according to the present invention.

FIG. 6 illustrates still another embodiment of a power MOSFET device according to the present invention, which is generally referred to as device 140. Device 140 is similar to device 110, except a portion of gate structure 153 is formed in a trench 152. Trench 152 is formed, for example, using conventional dry-etching techniques. Trench 152 allows for, among other things, higher density devices compared to device 110.

Like gate structure 123 in FIG. 5, gate structure 153 includes a gate dielectric layer that has a thick portion 158 and thin portions 156 to improve switching characteristics and to avoid the breakdown voltage degradation problem described above. Thick portion 158 is formed on a lower surface of trench 152. Preferably, device 140 includes a down-doped region 161 to compensate for the increase in accumulation resistance. Additionally, device 140 preferably includes one or both of mid-doped region 162 and up-doped region 163 to reduce bulk and spreading resistances.

Preferably, doped regions 161 and 162 are formed after trench 152 is formed. Up-diffusion region 163 is formed similar to up-doped region 63 as described above. Optionally, up-doped region 163 is formed using high energy implantation techniques. This depends on the distance between the bottom trench 152 and the bottom of semiconductor layer 42.

By now it should be appreciated that there has been provided a power MOSFET device having improved performance. By placing localized doped regions between the channel region and the highly doped drain region of the device, the $R_{DS(on)}$ of the device is improved. Also, by adding a groove or trench design together with a gate dielectric layer having a thick portions and thin portions, improved $R_{DS(on)}$, switching and breakdown voltage characteristics are achieved.

While the invention has been described with reference to particular embodiments, this is solely for purposes of illustration and is not to be construed as limiting the scope of the invention claimed below. For example, the n-channel structures shown can be modified to implement a p-channel device by reversing junction polarities and converting p-type dopants to n-type dopants and vice versa. Also, other semiconductor materials can be used in place of or in addition to silicon. Additionally other gate dielectric materials are easily incorporated including grown oxides, deposited oxide, nitrides, combinations thereof, or the like. Furthermore, the present invention is suitable for structures that do not utilize sub-photolithographic techniques (i.e., spacers).

What is claimed is:

1. A power MOSFET device comprising:
    a semiconductor substrate of a first conductivity type, wherein the semiconductor substrate forms a drain region;
    a semiconductor layer formed on the semiconductor substrate, the semiconductor layer having a major surface;
    a region of localized doping formed in the semiconductor layer, wherein the region of localized doping extends from the semiconductor substrate up to the major surface, the region of localized doping having the same conductivity type as the semiconductor layer and having a higher dopant concentration than the semiconductor layer;
    first and second doped regions formed in the semiconductor layer and extending from the major surface, wherein the first and second doped regions are spaced apart from the region of localized doping, and wherein the first and second doped regions have a second conductivity type, and wherein at least a portion of the region of localized doping is between the first and second doped regions;
    a first source region of the first conductivity type formed in the first doped region;
    a second source region of the first conductivity type formed in the second doped region; and
    a gate structure formed on the major surface.

2. The power MOSFET device of claim 1 wherein the gate structure includes a gate dielectric layer having a thick portion and thin portions.

3. The power MOSFET device of claim 2 wherein the thick portion comprises a LOCOS region.

4. The power MOSFET device of claim 1 further including a trench between the first and second source regions, and wherein the trench includes a bottom, and wherein a portion of the gate structure is formed in the trench.

5. The power MOSFET device of claim 4 wherein the gate structure includes a gate dielectric layer having a thick portion and thin portions, and wherein the thick portion is formed at the bottom of the trench.

6. The power MOSFET device of claim 1 further including a groove between the first and second source regions, and wherein the groove includes a lower surface, and wherein a portion of the gate structure is formed in the groove.

7. The power MOSFET device of claim 6 wherein the gate structure includes a gate dielectric layer having a thick portion and thin portions, and wherein the thick portion is formed on the lower surface of the groove.

8. An IGFET structure comprising:
    a semiconductor substrate of a first conductivity type, wherein the semiconductor substrate forms a drain region;
    a semiconductor layer formed on the semiconductor substrate, wherein the semiconductor layer has a first major surface, and wherein the semiconductor layer forms an interface with the semiconductor substrate;
    a region of localized doping formed in the semiconductor layer, the region of localized doping comprising the first conductivity type and having a higher dopant concentration than the semiconductor layer, wherein the region of localized doping extends from the first major surface to the semiconductor substrate, and wherein the region of localized doping has width;
    first and second doped regions formed in the semiconductor layer and extending from the first major surface, wherein the first and second doped regions are spaced apart from the region of localized doping, and wherein the first and second doped regions have a second conductivity type;
    a first source region of the first conductivity type formed in the first doped region;
    a second source region of the first conductivity type formed in the second doped region; and
    a gate structure formed on the first major surface and having a gate width, wherein the width of the region of localized doping is sufficiently less than the gate width near the interface between the semiconductor substrate and the semiconductor layer such that the on state resistance is decreased without significantly impacting breakdown voltage.

9. The IGFET structure of claim 8 wherein the gate structure includes a gate dielectric layer having a thick portion and thin portions.

10. The IGFET structure of claim 9 wherein the thick portion comprises a LOCOS region.

11. The IGFET structure of claim 8 further including a trench between the first and second source regions, and wherein the trench includes a bottom, and wherein a portion of the gate structure is formed in the trench.

12. The IGFET structure of claim 11 wherein the gate structure includes a gate dielectric layer having a thick portion and thin portions, and wherein the thick portion is formed at the bottom of the trench.

13. The IGFET structure of claim 8 further including a groove between the first and second source regions, and wherein the groove includes a lower surface, and wherein a portion of the gate structure is formed in the groove.

14. The IGFET structure of claim 13 wherein the gate structure includes a gate dielectric layer having a thick portion and thin portions, and wherein the thick portion is formed on the lower surface of the groove.

* * * * *